US011255869B2

(12) United States Patent
Yamamoto (10) Patent No.: US 11,255,869 B2
(45) Date of Patent: Feb. 22, 2022

(54) LEAD FRAME AND SENSOR DEVICE USING SAME

(71) Applicant: Mitsubishi Electric Corporation, Tokyo (JP)

(72) Inventor: Koki Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 200 days.

(21) Appl. No.: 16/774,189

(22) Filed: Jan. 28, 2020

(65) Prior Publication Data

US 2020/0333372 A1  Oct. 22, 2020

(30) Foreign Application Priority Data

Apr. 16, 2019  (JP) .............................. JP2019-077483

(51) Int. Cl.
*H01L 23/495*  (2006.01)
*G01P 3/44*  (2006.01)

(52) U.S. Cl.
CPC .......... *G01P 3/44* (2013.01); *H01L 23/49555* (2013.01)

(58) Field of Classification Search
CPC ................................................ H01L 23/49555
USPC .......................................................... 73/488
See application file for complete search history.

(56) References Cited

U.S. PATENT DOCUMENTS

| 5,921,818 | A | * | 7/1999 | Larsen | ............... H01R 13/6477 439/676 |
| 2008/0284273 | A1 | * | 11/2008 | Purvines | ............... H02K 11/215 310/418 |
| 2012/0291542 | A1 | | 11/2012 | Fujita et al. | |
| 2012/0293169 | A1 | | 11/2012 | Tsujii et al. | |
| 2016/0211199 | A1 | * | 7/2016 | Hagiwara | ......... H01L 23/49517 |

FOREIGN PATENT DOCUMENTS

| JP | 2012-242195 A | 12/2012 |
| JP | 2013-088335 A | 5/2013 |

* cited by examiner

*Primary Examiner* — Walter L Lindsay, Jr.
*Assistant Examiner* — Philipmarcus T Fadul
(74) *Attorney, Agent, or Firm* — Sughrue Mion, PLLC; Richard C Turner (57) ABSTRACT

Provided are a lead frame that allows changing of arrangement of contact electrodes, and a sensor device using the same. The lead frame is configured such that, when conductive wires having contact electrodes are developed on a plane, the conductive wires extend from the contact electrodes so as not to cross each other and are turned at first turned portions. The inner two wires are defined as a first group, and the remaining wires are defined as a second group. Each first group conductive wire has a second and a third turned portion turned in the opposite direction, the first group conductive wires are bent in opposite to the second group conductive wires, using, as an axis of a bending portion.

20 Claims, 12 Drawing Sheets

LEAD FRAME AND SENSOR DEVICE USING SAME

BACKGROUND OF THE INVENTION

1. Field of the Invention

The present disclosure relates to a lead frame including three or more conductive wires, and a sensor device using the same.

2. Description of the Background Art

A sensor provided in a sensor device for measuring rotation of an electric motor or an internal combustion engine is provided with contact electrodes on which three terminals, i.e., a power supply terminal, an output terminal, and a ground terminal, are arranged in a row. Similarly, connector terminals thereof to be connected to an external device are also configured to be arranged in a row.

A lead frame is composed of three metallic conductive wires arranged in parallel so as not to cross each other, and can make connections between the contact electrodes arranged in a row and the connector terminals to be connected to an external device (Patent Documents 1, 2).

Patent Document 1: Japanese Laid-Open Patent Publication No. 2012-242195

Patent Document 2: Japanese Laid-Open Patent Publication No. 2013-88335

The lead frames in Patent Document 1 and Patent Document 2 can make connections between the connector terminals and the contact electrodes of the sensor by conductive wires. The conductive wires forming the lead frame are connected so as to be arranged in parallel without crossing each other, and the arrangement order of the contact electrodes of the sensor and the arrangement order of the connector terminals are maintained as they are. Therefore, in the case of connecting an external device having an arrangement order different from the arrangement order of the contact electrodes of the sensor, it is necessary to form a detour wire at a certain part of the lead frame or to make a complicated bending structure, thus causing a problem that it takes a long time to work the lead frame and productivity is reduced.

SUMMARY OF THE INVENTION

The present disclosure has been made to solve the above problem, and an object of the present disclosure is to enable connection to be made while changing the arrangement order of connector terminals of a lead frame.

A lead frame according to one aspect of the present disclosure includes three or more conductive wires each having a contact electrode at one end thereof. When the three or more conductive wires are developed on a plane, from the contact electrodes arranged in a row in a first direction, each of the three or more conductive wires extends in a second direction perpendicular to the first direction so as not to cross each other, and is turned in an L shape at a first turned portion, to further extend. Of the three or more conductive wires, conductive wires having the first turned portions at first and second positions from an inner side are defined as first-group conductive wires, and conductive wires having the first turned portions at third and subsequent positions from the inner side are defined as second-group conductive wires. The first-group conductive wires each have, subsequent to extension from the first turned portion, a second turned portion turned in an L shape toward a contact electrode side, and next to the second turned portion, has a third turned portion turned in an L shape in a direction opposite to a turning direction of the second turned portion. Of the two first-group conductive wires, the conductive wire having the first turned portion on an innermost side is the smaller in length from the first turned portion to the second turned portion, and the greater in length from the second turned portion to the third turned portion. The conductive wire having the first turned portion at the second position from the inner side has a greater length from the second turned portion to the third turned portion than a distance in the second direction between the first turned portions of the two first-group conductive wires. The two first-group conductive wires, and the second-group conductive wire, are bent in directions opposite to each other, using, as an axis of a bending portion, the first direction passing through the third turned portion of the conductive wire having the first turned portion at the second position from the inner side.

The lead frame according to one aspect of the present disclosure enables connections to be made while the arrangement order of the connector terminals to be connected to an external device is changed from the arrangement order of the contact electrodes to be connected to the sensor.

DETAILED DESCRIPTION OF THE PREFERRED EMBODIMENTS OF THE INVENTION

In the descriptions of the embodiments and the drawings, parts denoted by the same reference characters indicate the same or corresponding parts.

First Embodiment

The first embodiment of the present disclosure will be described with reference to FIG. 1 to FIG. 6. In the present embodiment, description will be given of a lead frame in which three conductive wires are provided and which allows the arrangement order of connector terminals arranged in a row to be changed from the arrangement order of contact electrodes to be connected to the sensor side.

<Structure of Lead Frame>

Figure 1:
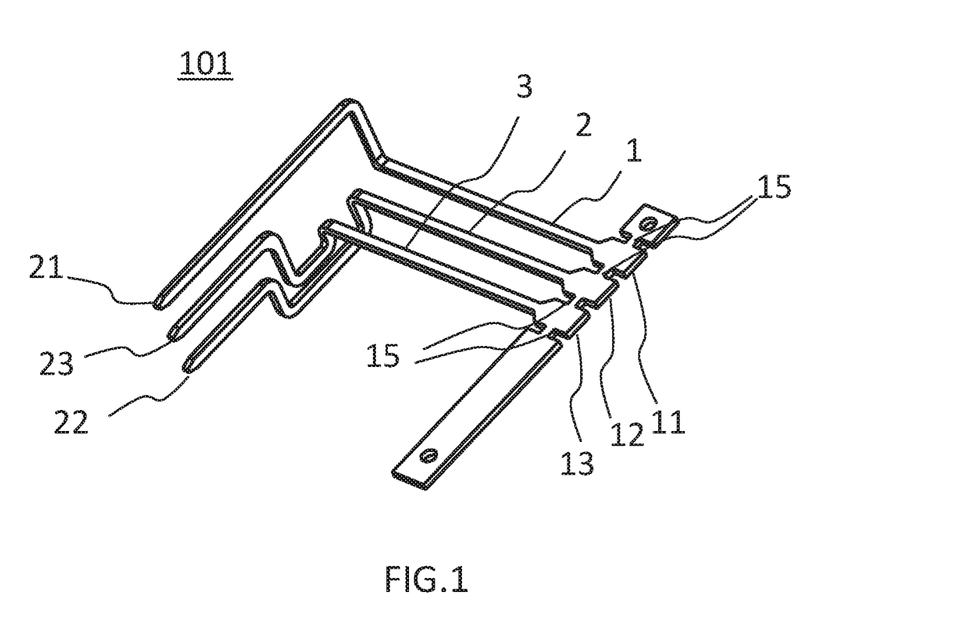
FIG. 1 is a perspective view showing a lead frame according to the first embodiment of the present disclosure.

With reference to FIG. 1, the structure of the lead frame that allows changing of the arrangement order of the connector terminals as desired will be described.

FIG. 1 is a perspective view showing the structure of a lead frame 101 according to the present embodiment. In the present embodiment, an example in which the lead frame 101 is composed of three conductive wires 1, 2, 3 will be shown.

The conductive wires 1, 2, 3 have, at ends thereof, contact electrodes 11, 12, 13 having flat shapes, respectively. The conductive wires 1, 2, 3 have, at the other ends, tip portions formed to be thin so as to be connected to an external device. These portions are referred to as connector terminals 21, 22, 23.

The contact electrodes 11, 12, 13 are connected via connection portions 15 in such a state that they can be cut off from each other. However, this is just for facilitating handling during manufacturing, and the connection portions 15 therebetween are cut when the lead frame is used in the sensor device.

The lead frame shown in FIG. 1 can be obtained by stamping a metal plate using a press. Other than this, cutting by a laser beam, or the like can be used.

For the bending part, a bending work technique such as press bending can be used.

The lead frame 101 shown in FIG. 1 is composed of three conductive wires 1, 2, 3, and the terminals are arranged as follows.

The lead frame 101 is formed in an almost L shape as a whole, and the contact electrodes 11, 12, 13 arranged in a row and the connector terminals 21, 22, 23 arranged in the same manner are arranged in directions different from each other by 90 degrees. As seen in the direction in FIG. 1, the contact electrodes 11, 12, 13 are arranged in a direction toward the far side in the drawing, and the connector terminals 21, 22, 23 are arranged in an up-down direction in the drawing.

The conductive wire 1 is located on the outermost side of the L-shaped structure, and connects the far-side contact electrode 11 of the three contact electrodes 11, 12, 13 and the upper-side connector terminal 21 of the three connector terminals 21, 22, 23.

Similarly, the conductive wire 2 located at the center connects the center contact electrode 12 and the lower-side connector terminal 22.

The innermost conductive wire 3 connects the left-end contact electrode 13 and the center connector terminal 23.

As will be described in detail later, in the bending process in the present embodiment, the three conductive wires are each bent at only one point at the same distances from the respective contact electrodes 11, 12, 13, and the bending direction of the conductive wire 1 and the bending direction of the conductive wires 2, 3 are opposite to each other.

As a result, regarding the two conductive wires 2, 3, the order of the contact electrodes 12, 13 and the order of the connector terminals 22, 23 are reversed to each other. Thus, the lead frame 101 described in the present embodiment allows changing of the arrangement order of the electrodes.

<Developed View of Lead Frame>

Figure 2:
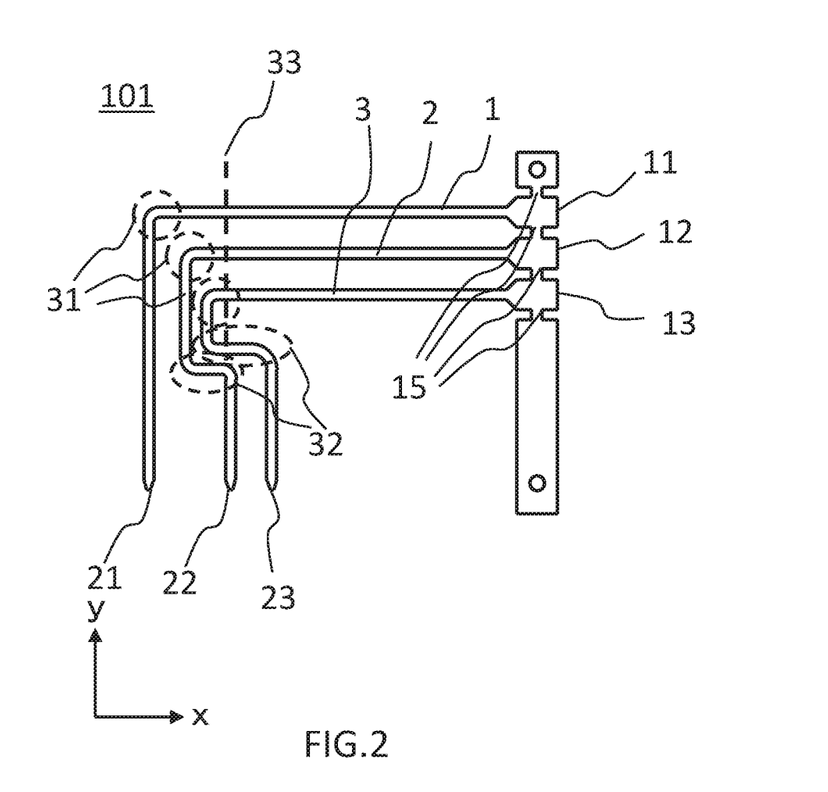
FIG. 2 is a developed view on xy plane of the lead frame according to the first embodiment.

FIG. 2 shows a developed view of the lead frame 101 according to the present embodiment. For convenience of description, the lead frame 101 is shown in a state of being developed on xy plane in which the direction from left to right on the drawing is defined as the positive direction of x axis and the direction from the lower side to the upper side on the drawing is defined as the positive direction of y axis, as indicated at lower left in FIG. 2.

The contact electrodes 11, 12, 13 are arranged in the y-axis direction, and the connector terminals 21, 22, 23 are arranged in the x-axis direction. The contact electrode 11 and the connector terminal 21 are connected to both ends of the conductive wire 1, the contact electrode 12 and the connector terminal 22 are connected to both ends of the conductive wire 2, and the contact electrode 13 and the connector terminal 23 are connected to both ends of the conductive wire 3.

As compared to FIG. 1, it is found that the arrangement order of the right-side two connector terminals 22 and 23 of the connector terminals 21, 22, 23 is reversed through assembling of the lead frame 101.

As shown in FIG. 2, the three conductive wires 1, 2, 3 each have an L-shaped turned portion 31 at one location. It is noted that, in the present embodiment, a turned part that has been already formed at a stage of a flat-plate state made from a metal plate by cutting, stamping, or the like, may be referred to as "turned portion", and a part bent by press bending or the like after the flat-plate state is made from a metal plate, may be referred to as "bending portion", and the axis about which the "bending portion" is bent may be referred to as axis of "bending portion".

The three conductive wires 1, 2, 3 extend in parallel in the negative direction of x axis from the contact electrodes 11, 12, 13, and have the turned portions 31. Further, from the turned portions 31, the three conductive wires 1, 2, 3 are turned by 90 degrees to the negative direction of y axis, to reach the respective ends having the connector terminals 21, 22, 23.

In the present embodiment, parts of the conductive wires 1, 2, 3 that extend from the contact electrodes 11, 12, 13 to the turned portions 31 are referred to as first extending portions, and parts extending in the negative direction of y axis from the turned portions 31 are referred to as second extending portions.

As shown in the drawings, the three conductive wires 1, 2, 3 are formed in an almost L shape as a whole, and the first extending portions of the conductive wires 1, 2, 3 from the contact electrodes 11, 12, 13 to the turned portions 31 are formed such that the one located closer to the outermost side of the L shape, i.e., the rightmost side with respect to the extending direction from the contact electrodes 11, 12, 13, has a greater length.

The two conductive wires 2 and 3 located on the inner side of the L shape, and the conductive wire 1 located on the outer side, are different in shape and the like. Therefore, the former conductive wires may be discriminated as first-group conductive wires 2, 3, and the latter conductive wire may be discriminated as a second-group conductive wire 1.

The first-group conductive wires 2, 3 located on the inner side of the L shape has, in addition to the turned portions 31, crank portions 32 in the second extending portions extending in the negative direction of y axis from the turned portions 31. Here, the crank portion 32 refers to a part consecutively turned at two locations where the wire is turned in an L shape leftward with respect to the extending direction of the second extending portion and then turned in an L shape rightward, and the interval between the parts turned in L shapes at two locations is referred to as the length of the crank portion 32.

The connector terminals 21, 22, 23 are arranged in the x-axis direction, and the distance between the connector terminal 22 positioned at the center and the connector terminal 21 positioned on the negative side in the x-axis direction is set to be twice the distance between the connector terminal 22 and the connector terminal 23 positioned on the positive side in the x-axis direction.

In the assembly process for the lead frame 101 described later, the three conductive wires 1, 2, 3 are subjected to bending work so as to bend the first extending portions extending in the x-axis direction between the contact electrodes 11, 12, 13 and the turned portions 31, using a bending portion 33 as an axis. In the lead frame 101 according to the present embodiment, the conductive wire 1 which is the second-group conductive wire is bent so as to protrude frontward with respect to the xy plane in FIG. 2. The conductive wire 2 and the conductive wire 3 which are the first-group conductive wires are bent in the direction opposite to the bending direction of the conductive wire 1. For the conductive wires 1, 2, 3 around the bending portion 33, it is important to prevent interference among the conductive wires 1, 2, 3 during bending work in the assembly process.

The second extending portions of the conductive wires 1, 2, 3 which are turned from the turned portions 31 by 90 degrees in the negative direction of y axis are formed to have different distances from the bending portion 33 so that they do not interfere with each other, in the bending work. Thus, when bending work is performed using the bending portion 33 as an axis, the distances of the conductive wires 1, 2, 3 are different from each other and therefore the conductive wires 1, 2, 3 do not interfere with each other.

The crank portions 32 are formed in the second extending portions of the conductive wires 2, 3 which are the first-group conductive wires.

The length of the crank portion 32 of the conductive wire 2 is greater than the difference between the lengths of the first extending portions of the conductive wire 2 and the conductive wire 3. Therefore, when bending is performed using the bending portion 33 as an axis, the bending portion 33 can be assuredly formed on the first extending portion of the conductive wire 3 located at the left with respect to the extending direction.

Regarding the positions of the crank portions 32 of the conductive wire 2 and the conductive wire 3, the conductive wire 2 located at the right with respect to the extending direction has the crank portion 32 at a position more advanced in the downward direction. Thus, when the conductive wires 2, 3 having the crank portions 32 are bent using the bending portion 33 as an axis, the conductive wire 2 rotates on the outer side around the bending portion 33, and the conductive wire 3 rotates on the inner side around the bending portion 33, so that they do not interfere with each other.

The bending portion 33 is located on the same axis as the center connector terminal 22. Meanwhile, the gap between the connector terminal 21 and the connector terminal 22 is formed to be wider than the gap between the connector terminal 22 and the connector terminal 23. Therefore, when the conductive wire 1 and the conductive wire 3 are bent at the bending portion 33 in directions opposite to each other around the connector terminal 22, the connector terminal 22 does not move and remains at the current position, whereas the connector terminal 23 moves to between the connector terminal 21 and the connector terminal 22. Thus, the arrangement order of the connector terminals 21, 22, 23 can be changed.

<Assembly of Lead Frame>

The assembly process for the lead frame 101 will be described with reference to FIGS. 3A to 3C, and further, the arrangement of the connector terminals 21, 22, 23 when bending work has been performed at the bending portion 33 will be described.

Figure 3A:
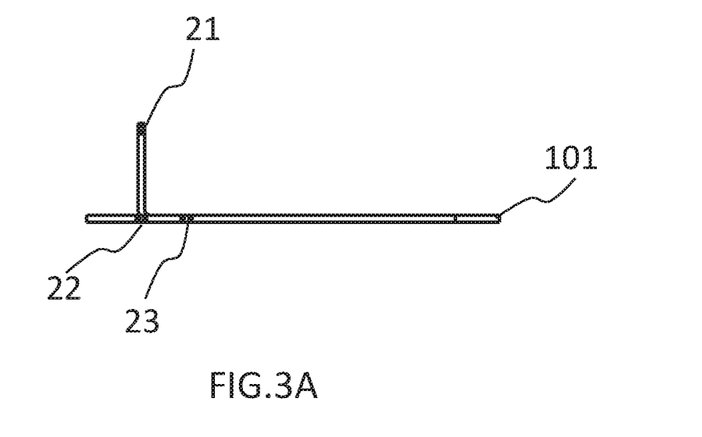
FIGS. 3A to 3C illustrate a working process for the lead frame according to the first embodiment.
Figure 3B:
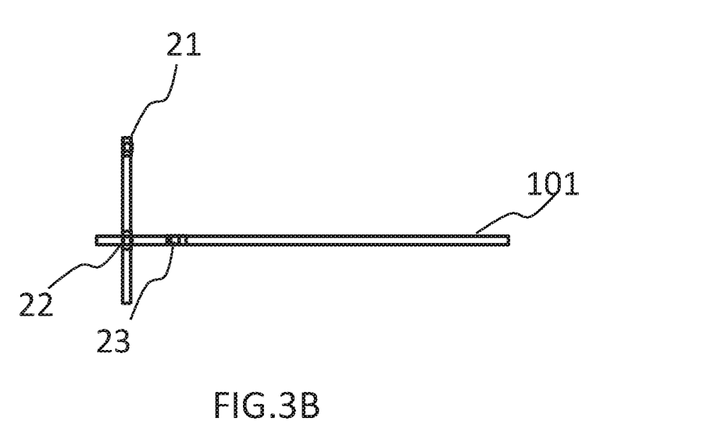
Figure 3C:
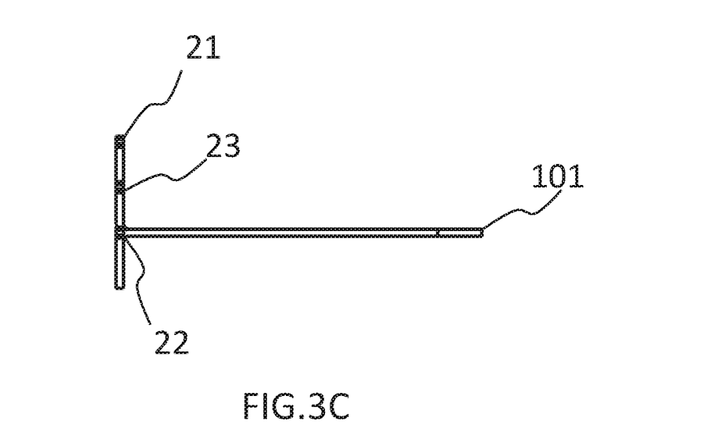

FIGS. 3A to 3C show side views as seen from the negative direction to the positive direction of y axis. FIG. 3A shows a state in which only the conductive wire 1 is bent at the bending portion 33. FIG. 3B shows a state in which, in addition to the conductive wire 1, the conductive wire 2 is bent at the bending portion 33. FIG. 3C shows a state in which all the conductive wires 1, 2, 3 are bent at the bending portion 33. It is noted that lines drawn in the plate thickness direction of the lead frame 101 in the drawings show the tip ends of the connector terminals 21, 22, 23.

FIG. 3A shows a side view in a state in which the conductive wire 1 of the developed lead frame 101 is bent.

In this state, the conductive wire 1 located on the outermost side in the developed lead frame 101 shown in FIG. 2 is bent at the bending portion 33, and in the side view shown in FIG. 3A, the conductive wire 1 having the connector terminal 21 at the end is bent by 90 degrees clockwise on the drawing (counterclockwise as seen in the extending direction of the conductive wire 1).

As a result of the above bending, the connector terminal 21 that has been located on the same plane as the connector terminal 22 and the connector terminal 23 in a developed state is to be located directly above the connector terminal 22.

FIG. 3B is a side view in a state in which the conductive wire 2 of the lead frame 101 is bent, and on the drawing, the conductive wire 2 is bent by 90 degrees counterclockwise.

Since the connector terminal 22 is located on the same axis as the bending portion 33, the position of the connector terminal 22 does not move, but the crank portion 32 protrudes downward.

FIG. 3C is a side view in a state in which the conductive wire 3 of the lead frame 101 is bent, and on the drawing, the conductive wire 3 is bent by 90 degrees counterclockwise.

Since the distance between the connector terminal 23 and the connector terminal 22 is half the distance between the connector terminal 21 and the connector terminal 22, the connector terminal 23 is to be located at the middle between the connector terminal 21 and the connector terminal 22.

As described above, the three conductive wires 1, 2, 3 are bent at the bending portion 33 by 90 degrees in opposite directions such that the conductive wire 1 which is the second-group conductive wire is bent clockwise on the drawing and the conductive wires 2, 3 which are the first-group conductive wires are bent counterclockwise on the drawing, and as a result, the arrangement order of the connector terminals, which had been arranged in the order of 21, 22, 23 in the developed state shown in FIG. 2, can be changed to the arrangement order of 21, 23, 22 as shown in FIG. 3C.

<Application Example of Lead Frame>

An application example of the lead frame 101 will be described with reference to the case where the lead frame 101 worked in the present embodiment is used for a sensor device 50, as an example.

Figure 4:
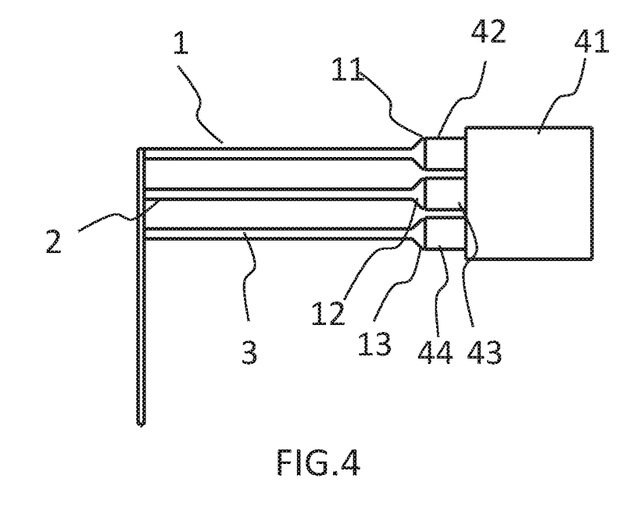
FIG. 4 shows an example in which the lead frame according to the first embodiment is attached to a sensor.

FIG. 4 shows a state of being connected to a sensor 41 in order to apply the lead frame 101 worked in the present embodiment to the sensor device 50, and shows a view when the contact electrodes 11, 12, 13 of the lead frame 101 are seen from directly above.

The sensor 41 has three electrodes, i.e., a power supply terminal electrode portion 42, an output terminal electrode portion 43, and a ground terminal electrode portion 44, which are connected to the contact electrodes 11, 12, 13, respectively. Connections between these electrode portions and the contact electrodes 11, 12, 13 are required to establish electric conductions, and therefore general soldering or the like can be used.

In FIG. 1, etc., the connection portions 15 are formed between the contact electrodes 11, 12, 13. However, the connection portions 15 are merely used for handling the three conductive wires 1, 2, 3 together, and it is necessary to cut them before connection to the sensor 41, so as to electrically separate the contact electrodes 11, 12, 13 from each other.

Figure 5:
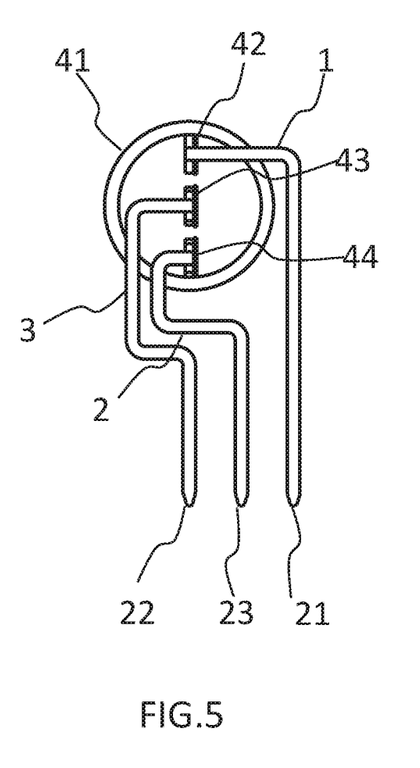
FIG. 5 shows an example in which the lead frame according to the first embodiment is attached to a sensor.

FIG. 5 is a view of the lead frame 101 connected to the sensor 41 shown in FIG. 4, as seen from another angle, i.e., as seen in such a direction that the conductive wires 1, 2, 3 at the bending portion 33 of the lead frame 101 can be observed.

As shown in FIG. 5, the electrodes of the sensor 41 are arranged in the order of power supply terminal electrode portion 42, output terminal electrode portion 43, ground terminal electrode portion 44, from the upper side. On the other hand, regarding the connector terminals 21, 22, 23, the connector terminal 23 connected to the ground terminal electrode portion 44 located at the lowermost position on the sensor 41 is located at the center, and thus the arrangement order of the terminals of the sensor 41 can be changed to the order of power supply terminal electrode portion 42, ground terminal electrode portion 44, output terminal electrode portion 43, from the right side.

Figure 6:
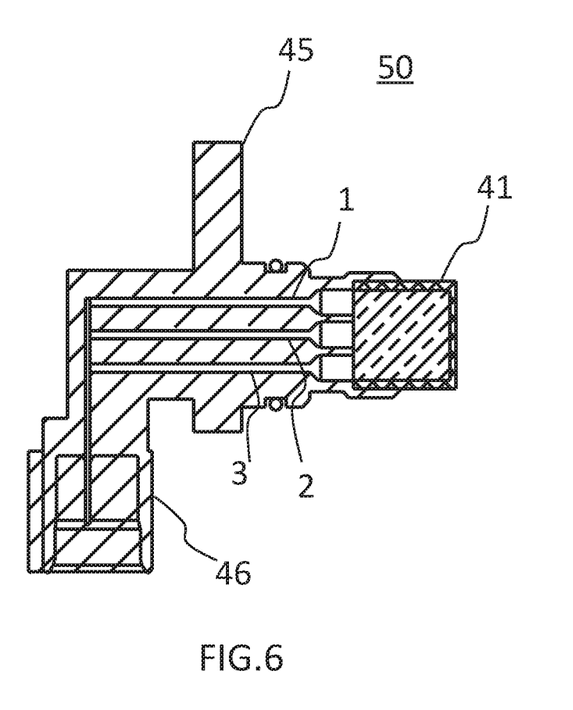
FIG. 6 shows an example in which the lead frame according to the first embodiment is applied to a sensor device.

FIG. 6 shows a state in which the lead frame 101 is connected to the sensor 41 and they are provided in a sensor device 50. In the sensor device 50, the sensor 41 is connected to the contact electrodes 11, 12, 13 of the lead frame 101, and using an exterior resin, a connector portion 46 is formed around the connector terminals 21, 22, 23 on the opposite side of the lead frame 101. Further, using an exterior resin, a housing portion 45 is formed around the lead frame 101 part, thus obtaining the sensor device 50.

Owing to application of the lead frame 101 according to the present embodiment, in the case where the arrangement order of the terminals of the sensor 41 is different from the arrangement order of the connector terminals 21, 22, 23 at the connector portion 46, the arrangement order can be changed without using a detour wire or a complicated bending structure of the conductive wires 1, 2, 3.

Second Embodiment

In the second embodiment of the present disclosure, a lead frame 102 will be described in which, while the lead frame 101 described in the first embodiment is directly used, additional working is performed to allow the connection direction of the connector terminals 21, 22, 23 to be changed by 90 degrees.

Figure 7:
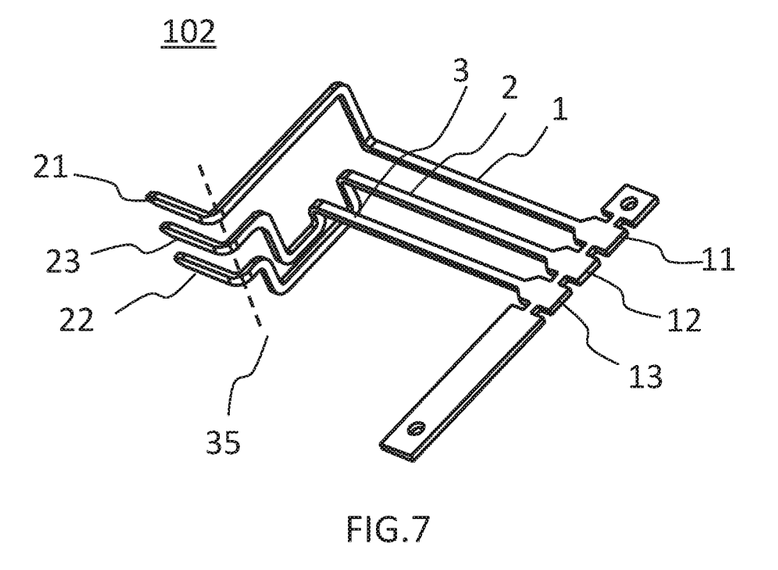
FIG. 7 is a perspective view showing a lead frame according to the second embodiment of the present disclosure.

FIG. 7 is a perspective view showing the structure of the lead frame 102 according to the present embodiment. The lead frame 102 according to the present embodiment is obtained by performing bending work one more time for the lead frame 101 shown in FIG. 1, etc. in the first embodiment, so that the three conductive wires 1, 2, 3 are bent by 90 degrees in the same direction in the vicinity of the connector terminals 21, 22, 23.

Figure 8:
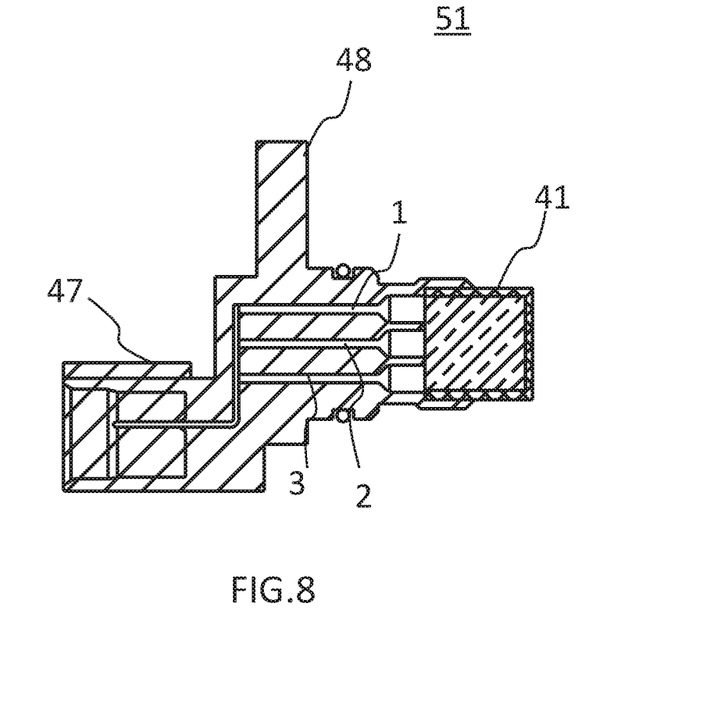
FIG. 8 shows an example in which the lead frame according to the second embodiment is applied to a sensor device.

FIG. 8 shows an application example of the lead frame 102 shown in FIG. 7.

The lead frame 102 is connected to a sensor 41, and a connector portion 47 is formed on the connector terminal 21, 22, 23 side. Further, using an exterior resin, a housing portion 48 is formed around the conductive wires 1, 2, 3, thus obtaining a sensor device 51.

In the present embodiment, there is a second bending portion 35 in the vicinity of the connector terminals 21, 22, 23 of the lead frame 102, and thus the connection direction of the connector portion 47 can be changed by 90 degrees as compared to the lead frame 101 of the first embodiment.

Owing to application of the lead frame 102 according to the present embodiment, in the case where the arrangement order of the terminals of the sensor 41 is different from the arrangement order of the connector terminals 21, 22, 23 at the connector portion 47, the arrangement order can be changed without using a detour wire or a complicated bending structure of the conductive wires 1, 2, 3.

In addition, the lead frame 102 according to the present embodiment enables the connection direction of the connector portion 47 to be changed by 90 degrees, as compared to the lead frame 101 of the first embodiment.

Third Embodiment

In the third embodiment of the present disclosure, a lead frame 103 including four conductive wires 1, 2, 3, 4 will be described.

Figure 9:
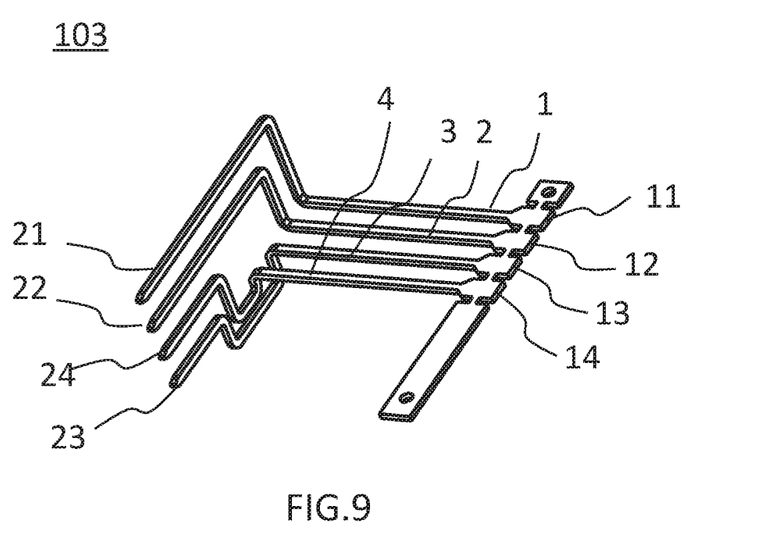
FIG. 9 is a perspective view showing a lead frame according to the third embodiment.
Figure 10:
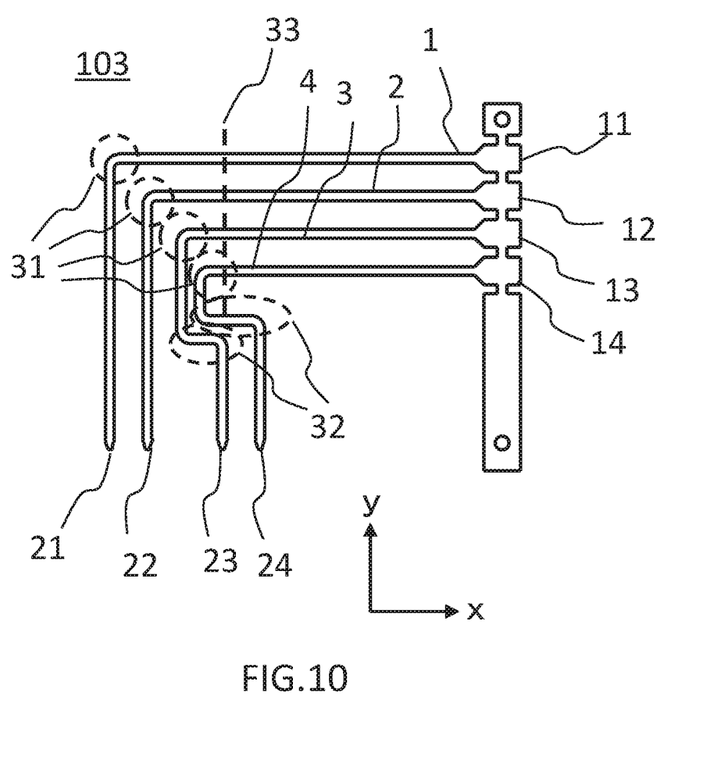
FIG. 10 is a developed view in xy plane of the lead frame according to the third embodiment.

FIG. 9 is a perspective view showing the structure of the lead frame 103 according to the present embodiment. FIG. 10 is a developed view on xy plane of the lead frame 103 according to the present embodiment.

The lead frame 103 of the present embodiment is greatly different from the lead frame 101 of the first embodiment in that the lead frame 103 is composed of four conductive wires 1, 2, 3, 4. Meanwhile, the lead frame 103 of the present embodiment and the lead frame 101 of the first embodiment have common features as follows: the contact electrodes 11, 12, 13, 14 are arranged in a row and the connector terminals 21, 22, 23, 24 are arranged in a row; the conductive wires 1, 2, 3, 4 have L-shaped turned portions 31; the conductive wires 3 and 4 located on the inner side have crank portions 32; and bending work is performed using, as the bending portion 33, the connector terminal 23 of the conductive wire 3 located at the second position from the inner side.

FIG. 10 shows a developed view of the lead frame 103 according to the present embodiment. Also here, for convenience of description, the lead frame 103 is shown in a state of being developed on the same plane in which the direction from left to right on the drawing is defined as the positive direction of x axis and the direction from the lower side to the upper side on the drawing is defined as the positive direction of y axis, as indicated in FIG. 10.

The contact electrodes 11, 12, 13, 14 are arranged in the y-axis direction, and the connector terminals 21, 22, 23, 24 are arranged in the x-axis direction.

As compared to FIG. 9, the arrangement order of the connector terminals 23, 24 is reversed through assembling of the lead frame 103.

As shown in FIG. 10, the four conductive wires 1, 2, 3, 4 extend in parallel in the negative direction of x-axis from the contact electrodes 11, 12, 13, 14, and have L-shaped turned portions 31. Then, the four conductive wires 1, 2, 3, 4 are turned by 90 degrees to the negative direction of y axis and further extend to reach the respective ends having the connector terminals 21, 22, 23, 24.

As shown in the drawings, the four conductive wires 1, 2, 3, 4 are formed in an almost L shape as a whole, and the first extending portions from the contact electrodes 11, 12, 13, 14 to the turned portions 31 are formed such that the one located closer to the outermost side of the L shape has a greater length.

The two conductive wires 1 and 2 on the outer side have only the L-shaped turned portions 31, whereas the two conductive wires 3 and 4 on the inner side have, in addition to the turned portions 31, crank portions 32 in the second extending portions formed after the L-shaped turned portions 31.

The connector terminals 21, 22, 23, 24 are arranged in the x-axis direction, and the distance between the connector terminal 23 and the connector terminal 22 located at the second and third positions from the inner side is set to be twice the distances between the other adjacent connector terminals.

In the present embodiment, bending work is performed using the bending portion 33 as an axis, around the connector terminal 23. As in the first embodiment, the four conductive wires 1, 2, 3, 4 can be discriminated as the conductive wires 3, 4 which are the first-group conductive wires, and the conductive wires 1, 2 which are the second-group conductive wires. The conductive wire 3 and the conductive wire 4 which are the first-group conductive wires located on the inner side are bent by 90 degrees counterclockwise as seen from the connector terminal 23 side, and the conductive wire 1 and the conductive wire 2 which are the second-group conductive wires located on the outer side are bent by 90 degrees clockwise, whereby the lead frame 103 shown in FIG. 9 can be obtained.

The lead frame 103 enables the arrangement order of the connector terminal 23 and the connector terminal 24 located on the inner side to be changed without interference among the conductive wires 1, 2, 3, 4 formed in an L shape, through assembling.

Fourth Embodiment

Figure 11:
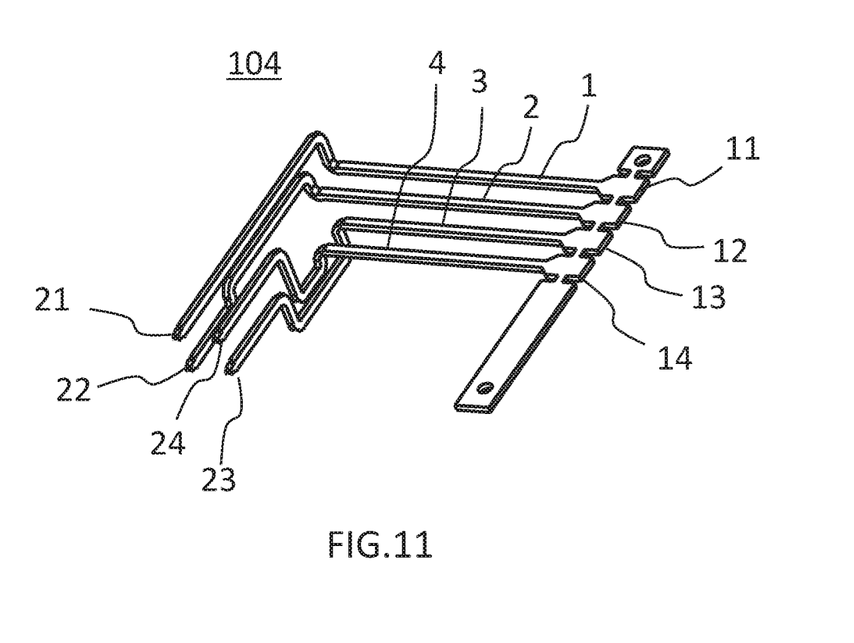
FIG. 11 is a perspective view of a lead frame according to the fourth embodiment.
Figure 12:
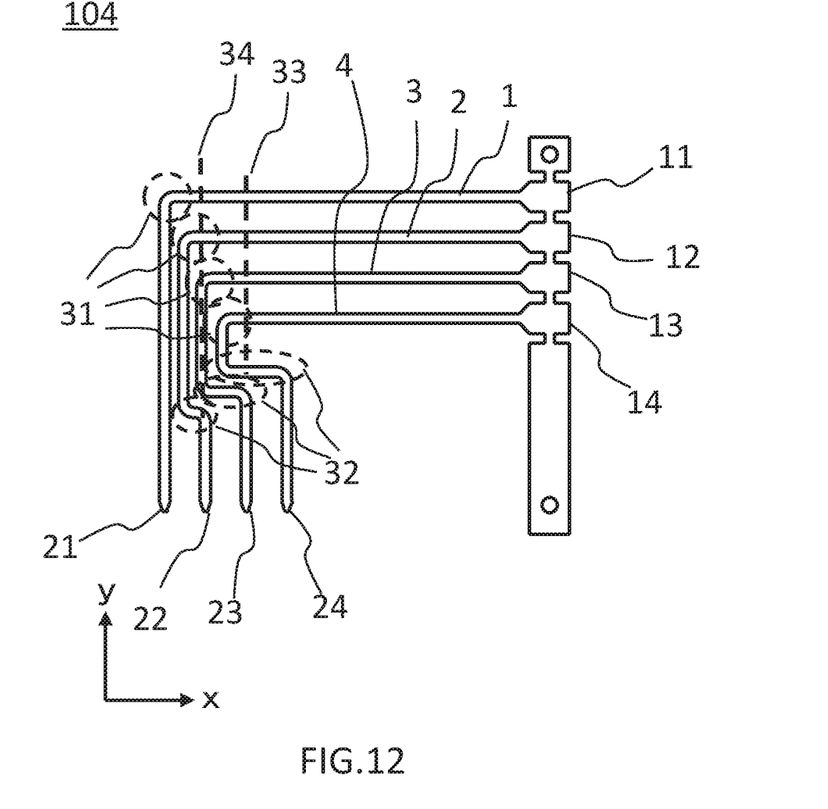
FIG. 12 is a developed view on xy plane of the lead frame according to the fourth embodiment.

FIG. 11 is a perspective view showing the structure of a lead frame 104 according to the fourth embodiment of the present disclosure, and FIG. 12 is a developed view of the lead frame 104.

The lead frame 104 of the present embodiment is greatly different from the lead frame 103 of the third embodiment in that the lead frame 104 including four conductive wires 1, 2, 3, 4 has two bending portions 33, 34.

The lead frame 104 of the present embodiment has the bending portion 34 with its axis corresponding to the connector terminal 22 of the conductive wire 2 located at the second position from the outer side, and the bending portion 33 with its axis corresponding to the connector terminal 23 of the conductive wire 3 located at the second position from the inner side.

The conductive wire 1 and the conductive wire 2 which are the two second-group conductive wires on the outer side are bent at the bending portion 34 by 90 degrees clockwise as seen from the connector terminal 22 side, and the conductive wire 3 and the conductive wire 4 which are the two first-group conductive wires on the inner side are bent at the bending portion 33 by 90 degrees counterclockwise as seen from the connector terminal 23 side.

The three conductive wires 2, 3, 4 may be discriminated as third-group conductive wires from the other groups in that the three conductive wires 2, 3, 4 have the crank portions 32.

The conductive wires 1, 2, 3, 4 are bent at the two bending portions 33, 34 by 90 degrees, whereby a pair of the connector terminals 21 and 22 of the conductive wires 1 and 2 on the outer side, and a pair of the connector terminals 24 and 23 of the conductive wires 3 and 4 on the inner side, can be arranged in two respective rows, and thus the arrangement direction of the connector terminals 21, 22, 23, 24 can be changed from that in the developed state.

The lead frame according to the present disclosure enables the arrangement configuration of the connector terminals to be changed from that in the developed state through an assembly work of bending the conductive wires. Thus, in a sensor device, the arrangement of connector terminals and the arrangement of contact electrodes of a sensor can be made different from each other by the lead frame, and this also provides an effect of enhancing the degree of freedom in designing of the sensor device.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1, 2, 3, 4 conductive wire
11, 12, 13, 14 contact electrode
15 connection portion
21, 22, 23, 24 connector terminal
31 turned portion
32 crank portion
33, 34 bending portion
35 bending portion
41 sensor
42 power supply terminal electrode portion
43 output terminal electrode portion
44 ground terminal electrode portion
45, 48 housing portion
46, 47 connector portion
50, 51 sensor device
101, 102, 103, 104 lead frame

What is claimed is:

1. A lead frame comprising three or more conductive wires each having a contact electrode at one end thereof, wherein
when the three or more conductive wires are developed on a plane,
from the contact electrodes arranged in a row in a first direction, each of the three or more conductive wires extends in a second direction perpendicular to the first direction so as not to cross each other, and is turned in an L shape at a first turned portion, to further extend,
of the three or more conductive wires, conductive wires having the first turned portions at first and second positions from an inner side are defined as first-group conductive wires, and conductive wires having the first turned portions at third and subsequent positions from the inner side are defined as second-group conductive wires, the first-group conductive wires each have, subsequent to extension from the first turned portion, a second turned portion turned in an L shape toward a contact electrode side, and next to the second turned portion, has a third turned portion turned in an L shape in a direction opposite to a turning direction of the second turned portion, of the two first-group conductive wires, the conductive wire having the first turned portion on an innermost side is the smaller in length from the first turned portion to the second turned portion, and the greater in length from the second turned portion to the third turned portion, the conductive wire having the first turned portion at the second position from the inner side has a greater length from the second turned portion to the third turned portion than a distance in the second direction between the first turned portions of the two first-group conductive wires, and the two first-group conductive wires, and the second-group conductive wire, are bent in directions opposite to each other, using, as an axis of a bending portion, the first direction passing through the third turned portion of the conductive wire having the first turned portion at the second position from the inner side.

2. The lead frame according to claim 1, wherein
the three or more conductive wires have connector terminals at other ends opposite to the contact electrodes,
the connector terminals are arranged in a row in the second direction, and
a gap between the connector terminals connected to the conductive wires having the first turned portions at the second position and the third position from the inner side is greater than a gap between the connector terminals connected to the two first-group conductive wires.

3. The lead frame according to claim 2, wherein
the first-group conductive wires are each bent in a perpendicular direction counterclockwise with respect to a direction in which the third turned portion is seen from the connector terminal.

4. The lead frame according to claim 3, wherein
the contact electrodes are connected by connection portions so as to be able to be cut off from each other.

5. A sensor device comprising the lead frame according to claim 4, wherein
the contact electrodes of the lead frame are connected to a sensor.

6. A sensor device comprising the lead frame according to claim 3, wherein
the contact electrodes of the lead frame are connected to a sensor.

7. The lead frame according to claim 2, wherein
the contact electrodes are connected by connection portions so as to be able to be cut off from each other.

8. A sensor device comprising the lead frame according to claim 7, wherein
the contact electrodes of the lead frame are connected to a sensor.

9. A sensor device comprising the lead frame according to claim 2, wherein
the contact electrodes of the lead frame are connected to a sensor.

10. The lead frame according to claim 1, wherein
the contact electrodes are connected by connection portions so as to be able to be cut off from each other.

11. A sensor device comprising the lead frame according to claim 10, wherein
the contact electrodes of the lead frame are connected to a sensor.

12. A sensor device comprising the lead frame according to claim 1, wherein
the contact electrodes of the lead frame are connected to a sensor.

13. A lead frame comprising four or more conductive wires each having a contact electrode at one end thereof, wherein
when the four or more conductive wires are developed on a plane,
from the contact electrodes arranged in a row in a first direction, each of the four or more conductive wires extends in a second direction perpendicular to the first direction so as not to cross each other, and is turned in an L shape at a first turned portion, to further extend,
of the four or more conductive wires, conductive wires having the first turned portions at first and second positions from an inner side are defined as first-group conductive wires, conductive wires having the first turned portions at third and subsequent positions from the inner side are defined as second-group conductive wires, and conductive wires having the first turned portions at the first to third positions from the inner side are defined as third-group conductive wires,
the third-group conductive wires each have, subsequent to extension from the first turned portion, a second turned portion turned in an L shape toward a contact electrode side, and next to the second turned portion, has a third turned portion turned in an L shape in a direction opposite to a turning direction of the second turned portion,
of the three third-group conductive wires, the conductive wire having the first turned portion closer to an innermost side is smaller in length from the first turned portion to the second turned portion, and greater in length from the second turned portion to the third turned portion,
the conductive wire having the first turned portion at the second position from the inner side has a greater length from the second turned portion to the third turned portion than a distance in the second direction between the first turned portions of the two first-group conductive wires, and
the two first-group conductive wires are bent using, as an axis of a bending portion, the first direction passing through the third turned portion of the conductive wire having the first turned portion at the second position from the inner side, and the second-group conductive wires are bent using, as an axis of a bending portion, the first direction passing through the third turned portion of the conductive wire having the first turned portion at the third position from the inner side, such that the two first-group conductive wires, and the second-group conductive wires, are bent in directions opposite to each other.

14. The lead frame according to claim 13, wherein
the four or more conductive wires have connector terminals at other ends opposite to the contact electrodes,
the connector terminals are arranged in a row in the second direction, and
gaps between the adjacent connector terminals are equal to each other.

15. The lead frame according to claim 14, wherein
the contact electrodes are connected by connection portions so as to be able to be cut off from each other.

16. A sensor device comprising the lead frame according to claim 15, wherein
the contact electrodes of the lead frame are connected to a sensor.

17. A sensor device comprising the lead frame according to claim 14, wherein
the contact electrodes of the lead frame are connected to a sensor.

18. The lead frame according to claim 13, wherein
the contact electrodes are connected by connection portions so as to be able to be cut off from each other.

19. A sensor device comprising the lead frame according to claim 18, wherein
the contact electrodes of the lead frame are connected to a sensor.

20. A sensor device comprising the lead frame according to claim 13, wherein
the contact electrodes of the lead frame are connected to a sensor.

* * * * *